United States Patent
Oderkerk et al.

(10) Patent No.: US 10,505,060 B2
(45) Date of Patent: *Dec. 10, 2019

(54) POLYMER COMPOSITION FOR A LAYER OF A LAYER ELEMENT

(71) Applicant: BOREALIS AG, Vienna (AT)

(72) Inventors: Jeroen Oderkerk, Stenungsund (SE); Francis Costa, Linz (AT); Bart Verheule, Schelle (BE); Tanja Piel, Linz (AT); Bernt-Ake Sultan, Stenungsund (SE); Bert Broeders, Beringen (BE); Stefan Hellstrom, Kungalv (SE); Mattias Bergqvist, Goteberg (SE); Girish Suresh Galgali, Linz (AT)

(73) Assignee: BOREALIS AG, Vienna (AT)

( * ) Notice: Subject to any disclaimer, the term of this patent is extended or adjusted under 35 U.S.C. 154(b) by 26 days.

This patent is subject to a terminal disclaimer.

(21) Appl. No.: 15/510,963

(22) PCT Filed: Sep. 18, 2015

(86) PCT No.: PCT/EP2015/071020
§ 371 (c)(1),
(2) Date: Mar. 13, 2017

(87) PCT Pub. No.: WO2016/041924
PCT Pub. Date: Mar. 24, 2016

(65) Prior Publication Data
US 2017/0243996 A1     Aug. 24, 2017

(30) Foreign Application Priority Data

Sep. 18, 2014   (EP) .................................. 14185402

(51) Int. Cl.
   *C08L 23/00*   (2006.01)
   *H01L 31/048*  (2014.01)
   (Continued)

(52) U.S. Cl.
   CPC ........ *H01L 31/0481* (2013.01); *C08F 210/02* (2013.01); *C08L 23/0869* (2013.01);
   (Continued)

(58) Field of Classification Search
   None
   See application file for complete search history.

(56) References Cited

U.S. PATENT DOCUMENTS 4,297,310 A   10/1981   Akutsu et al.
4,351,876 A    9/1982   Doi et al.
(Continued)

FOREIGN PATENT DOCUMENTS

CN       102067331 A    5/2011
EP       1 254 923 A1   6/2002
(Continued)

OTHER PUBLICATIONS

Japanese Office action for Application No. 2017-514414, dated Feb. 13, 2018.
(Continued)

*Primary Examiner* — Robert S Loewe
(74) *Attorney, Agent, or Firm* — Tarolli, Sundheim, Covell & Tummino LLP

(57) ABSTRACT

The present invention relates to a polymer composition, to a layer element, preferably to at least one layer element of a photovoltaic module, comprising the polymer composition and to an article which is preferably said at least one layer of a layer element, preferably of a layer element of a photovoltaic module.

20 Claims, 1 Drawing Sheet

(51) Int. Cl.
*C08L 23/08* (2006.01)
*C08F 210/02* (2006.01)

(52) U.S. Cl.
CPC ... *C08L 2203/204* (2013.01); *C08L 2203/206* (2013.01); *C08L 2312/08* (2013.01); *Y02E 10/50* (2013.01)

(56) References Cited

U.S. PATENT DOCUMENTS

| | | | |
|---|---|---|---|
| 4,397,981 A | 8/1983 | Doi et al. | |
| 4,413,066 A | 11/1983 | Isaka et al. | |
| 4,446,283 A | 5/1984 | Doi et al. | |
| 4,456,704 A | 6/1984 | Fukumura et al. | |
| 2010/0126557 A1 | 5/2010 | Chou | |
| 2011/0126887 A1* | 6/2011 | Sultan | H01L 31/0481 136/251 |
| 2013/0167911 A1 | 7/2013 | Ikenanga et al. | |
| 2014/0360560 A1* | 12/2014 | Taniguchi | H01L 31/0481 136/251 |
| 2015/0112007 A1* | 4/2015 | Andreasson | H01B 7/295 524/266 |

FOREIGN PATENT DOCUMENTS

| | | |
|---|---|---|
| EP | 1 862 496 A1 | 12/2007 |
| EP | 2 144 301 A | 1/2010 |
| JP | H05186610 A | 7/1993 |
| JP | 2002009309 A | 1/2002 |
| JP | 2017-529427 A | 10/2017 |
| JP | 2017-531065 A | 10/2017 |
| JP | 2017-534698 A | 11/2017 |
| WO | 2005/003199 A1 | 1/2005 |
| WO | 2010/003503 A1 | 1/2010 |
| WO | 2016/041924 A1 | 3/2016 |

OTHER PUBLICATIONS

Heino, E-L, "The Influence if Molecular Structure on Some Rheological Properties of Polyethylene", vol. 3, 1995.
Randall, James, "A Review of High Resolution Liquid 13 Carbon Nuclear Magnetic Resonance Characterizations of Ethylene-Based Polymers", Rev. Macromol. Chem. Phys., C29(2 & 3), 201-317 (1989).
Kaye, A., et al., "Definition of Terms Relating to the Non-Ultimate Mechanical Properties of Polymers", Chem., vol. 70, No. 3, pp. 701-754, 1998.
Zweifel, Hans., "Plastics Additives Handbook", 5th edition, 2001.
Jackson, C., et al., "Molecular WeightSensitive Detectors for Size Exclusion Chromatography", pp. 103-145, 1995.
Klimesch, R., et al., "Polyethylene: High-pressure", Encyclopedia of Material Science and Technology, 2001, pp. 7181-7184.
"Ethylene Polymers, HDPE", Encyclopedia of Polymer Science and Technology, vol. 2.
Office Action for Taiwan Application No. 104130266.
Chinese Office action for Patent Application No. 201580046969.5, dated Dec. 5, 2018.

* cited by examiner

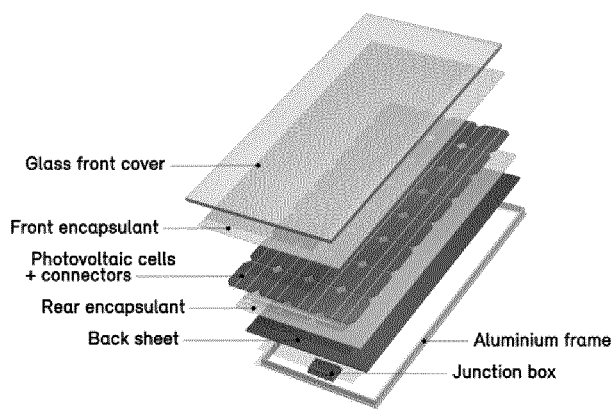

POLYMER COMPOSITION FOR A LAYER OF A LAYER ELEMENT

The present invention relates to a polymer composition, to a layer element, preferably to at least one layer element of a photovoltaic module, comprising the polymer composition and to an article which is preferably said at least one layer of a layer element, preferably of a layer element of a photovoltaic module.

Photovoltaic modules, also known as solar cell modules, produce electricity from light and are used in various kind of applications as well known in the field. The type of the photovoltaic module can vary. The modules have typically a multilayer structure, i.e. several different layer elements which have different functions. The layer elements of the photovoltaic module can vary with respect to layer materials and layer structure. The final photovoltaic module can be rigid or flexible. The rigid photovoltaic module can for example contain a rigid glass top element, front encapsulation layer element, at least one element of photovoltaic cells together with connectors, rear encapsulation layer element, a backsheet layer element and e.g. an aluminium frame. All said terms have a well known meaning in the art. In flexible modules the top layer element can be e.g. a fluorinated layer made from polyvinylfluoride (PVF) or polyvinylidenefluoride (PVDF) polymer. The encapsulation layer is typically made from ethylene vinyl acetate (EVA).

The above exemplified layer elements can be monolayer or multilayer elements. Moreover, there may be adhesive layer(s) between the layers of an element or between the different layer elements.

For solar encapsulant layer element a low processing viscosity is important for efficient film extrusion. At the same time a high zero shear rate viscosity is needed to improve the adhesion properties of the solar module. Viscosity and adhesion can be modified e.g. by incorporating crosslinkable silane group(s) containing units to the polymer and by partial crosslinking of said crosslinkable silane group(s) containing units. The drawback of crosslinking is often the problem in controlling the crosslink reaction during storage, i.e. the storage stability of such polymer may be impaired.

There is a continuous need for new polymer compositions for layer element(s) of photovoltaic modules to meet the various demands required in the growing and further developing photovoltaic module industry.

FIGURES

FIG. 1 illustrates schematically one example of a photovoltaic module.

DESCRIPTION OF THE INVENTION

Accordingly, the present invention provides a polymer composition comprising
i) a polymer of ethylene (a) with a polar comonomer(s), wherein
  the polar comonomer is selected from the group of methyl acrylate and methyl methacrylate, and wherein
  the polymer of ethylene (a) optionally bears functional group(s) containing units other than said polar comonomer, and
ii) silane group(s) containing units (b),
wherein the polymer composition has
  an $MFR_2$ of 13 to 70 g/10 min (according to ISO 1133 at 190° C. and at a load of 2.16 kg), and
  a Shear Thinning Index, $SHI_{0.05/300}$, of 10.0 to 35.0, when measured according to "Rheological properties: Dynamic Shear Measurements (frequency sweep measurements)" as described below under "Determination Methods".

The polymer composition of the invention is highly advantageous for at least one layer of a layer element.

The polymer composition of the invention as defined above or below is referred herein also shortly as "polymer composition" or "composition". "Polymer of ethylene (a) with a polar comonomer(s)" as defined above, below or in claims is referred herein also shortly as "polymer of ethylene (a)" or "polar polymer".

The expression "with a polar comonomer(s)" means herein that ethylene can contain one or more polar comonomers which are different.

Polymer of ethylene (a) preferably contains one polar comonomer as the polar comonomer(s).

As well known "comonomer" refers to copolymerisable comonomer units.

Unexpectedly, although the MFR of the polymer of ethylene (a) of the polymer composition of the invention is higher than MFR that is conventionally used in ethylene acrylate copolymers and ethylene vinyl acetate copolymers for layers of layer elements, preferably in layers of PV layer elements, the claimed polymer composition of the invention comprising said polymer of ethylene (a) and, additionally, comprising silane group(s) containing units (b), as defined in claims or below, has unexpectedly advantageous rheological properties together with the highly advantageous adhesion, which make the polymer composition highly suitable for the said at least one layer of a layer element of a photovoltaic (PV) module. Namely, the specific claimed polar comonomer, preferably methyl acrylate comonomer of the polymer of ethylene (a), provides a surprisingly high SHI behaviour to the polymer composition, which enables higher production rates in terms of the compounding (extrusion) step and the subsequent article, preferably layer, formation (e.g. extrusion (including coextrusion)) for producing the article, preferably a layer of an layer element.

The polymer composition of the invention can also provide highly advantageous storage stability, since the good rheology and adhesion can be provided without carrying out any additional crosslinking step by introducing any conventionally used condensation catalyst or peroxide as a crosslinking agent.

The property balance is industrially highly feasible and not predictable from the prior art.

Further surprisingly the polymer composition of the invention preferably provides, in addition to said rheological and adhesion property balance, also an unexpectedly advantageous property balance between the optical properties and mechanical properties.

The polymer composition as defined in claims or below, has preferably excellent heat stability expressed as difference in Refractive Index at certain temperature range while maintaining good adhesion properties.

Furthermore, the polymer composition of the invention with polar polymer has preferably electrical properties, indicated e.g. as volume resistivity, which are unexpectedly good at all temperatures, and can even be improved at higher temperatures, compared to non-polar ethylene copolymers.

The invention further provides an article comprising the polymer composition of the invention as defined above, below or in claims. The article preferably comprises a layer element which comprises at least one layer comprising the polymer composition of the invention as defined above, below or in claims. The layer element can be a monolayer element or a multilayer element. Moreover, the article may comprise more than one layer elements.

The expression "at least one layer" of a layer element means that a multilayer element may comprise more than one layers of the polymer composition of the invention and also that more than one layer element, if present in the article, may contain the layer(s) of the polymer composition of the invention. Moreover, it is evident that, that in case of the optional monolayer element, the at least one layer forms (is) said optional monolayer element.

The at least one layer of a layer element of the invention is typically at least one film layer of a monolayer film or multilayer film element.

The polymer composition of the invention is highly useful for photovoltaic module applications, preferably for at least one layer of a layer element of a photovoltaic module.

Accordingly, the preferred article of the invention is a photovoltaic module comprising a photovoltaic element and a layer element comprising at least one layer which comprises, preferably consists of, the polymer composition of the invention as defined above, below or in claims. The layer element of said preferred photovoltaic module can be a monolayer element or a multilayer element. The photovoltaic module typically comprises one or more photovoltaic elements and one or more layer elements, wherein at least one layer element is the layer element of the invention.

The "at least one layer" of the invention contributes to the properties, preferably to any one or more of mechanical, optical, electrical (e.g. insulation or conductive) or fire retarding properties, which are desired or required for the layer element of the PV module.

In a preferable embodiment of the invention the at least one layer is a layer of an encapsulation element or a layer of a backsheet element, preferably a layer of an encapsulation element.

It is understood that there can be an adhesive layer (also known as, for instance, a tie or a sealing layer) between any two layers of a multilayer element, or between two, functionally different layer elements, for enhancing the adhesion of the adjacent layers or, respectively, of the adjacent elements. Such adhesive layer typically comprise polymer component which is maleic anhydride (MAH) grafted as well known in the art. Herein the adhesive layer is not included within the meaning of the "at least one layer". Accordingly, the "at least one layer" of the invention is other than said adhesive layer comprising a MAH grafted polymer component.

Preferably the thickness of the at least one layer of the invention is at least 100 µm. The thickness of the at least one layer of the invention is typically from 100 µm to 2 mm.

The photovoltaic module may comprise also layers which are not "at least one layer" of the invention or layer element(s) which do not contain the "at least one layer" of the invention. For instance, the photovoltaic module may comprise a layer of a layer element or an adhesive layer in a layer element or between two layer elements, which may also comprise the polymer composition of the invention which is further modified by grafting with MAH groups.

The "photovoltaic element" means that the element has photovoltaic activity. The photovoltaic element can be e.g. an element of photovoltaic cell(s), which has a well known meaning in the art. Silicon based material, e.g. crystalline silicon, is a non-limiting example of materials used in photovoltaic cell(s). Crystalline silicon can vary with respect to crystallinity and crystal size, as well known to a skilled person. Alternatively, the photovoltaic element can be a substrate layer on one surface of which a further layer or deposit with photovoltaic activity is subjected, for example a glass layer, wherein on one side thereof an ink material with photovoltaic activity is printed, or a substrate layer on one side thereof a material with photovoltaic activity is deposited. For instance, in well-known thin film solutions of photovoltaic elements e.g. an ink with photovoltaic activity is printed on one side of a substrate, which is typically a glass substrate. Accordingly, the at least one layer of the invention can also be a layer in any layer element of a thin film based photovoltaic module.

The photovoltaic element is most preferably an element of photovoltaic cell(s).

"Photovoltaic cell(s)" means herein a layer element(s) of photovoltaic cells, as explained above, together with connectors.

The silane group(s) containing units (b) and the polymer of ethylene (a) can be present as a separate components, i.e. as blend, in the polymer composition of the invention or the silane group(s) containing units (b) can be present as a comonomer of the polymer of ethylene (a) or as a compound grafted chemically to the polymer of ethylene (a).

In case of a blend, the polymer of ethylene (a) and the silane group(s) containing units (b) component (compound) may, at least partly, be reacted chemically, e.g. grafted using optionally e.g. a radical forming agent, such as peroxide. Such chemical reaction may be carried out before or during the production process of an article, preferably a layer, of the invention.

The polymer of ethylene (a) preferably bears functional group(s) containing units.

Preferably the silane group(s) containing units (b) are present in the polymer of ethylene (a). Accordingly, most preferably the polymer of ethylene (a) bears functional group(s) containing units, whereby said functional group(s) containing units are said silane group(s) containing units (b).

The silane group(s) containing units (b) are preferably hydrolysable silane group(s) containing units which are crosslinkable.

If desired the polymer composition, preferably the polymer of ethylene (a), can be crosslinked via the silane group(s) containing units (b), which are preferably present in the polymer of ethylene (a) as said optional and preferable functional group(s) containing units.

The optional crosslinking is carried out in the presence of conventional silanol condensation catalyst (SCC). Accordingly, during the optional crosslinking, the preferable hydrolysable silane group(s) containing units (b) present in the polymer of ethylene (a) are hydrolysed under the influence of water in the presence of the silanol condensation catalyst (SCC) resulting in the splitting off of alcohol and the formation of silanol groups, which are then crosslinked in a subsequent condensation reaction wherein water is split off and Si—O—Si links are formed between other hydrolysed silane groups present in said polymer of ethylene (a). Silane crosslinking techniques are known and described e.g. in U.S. Pat. Nos. 4,413,066, 4,297,310, 4,351,876, 4,397,981, 4,446,283 and 4,456,704. The crosslinked polymer composition has a typical network, i.a. interpolymer crosslinks (bridges), as well known in the field. The silanol condensation catalyst (SCC) suitable for the present invention are either well known and commercially available, or can be produced according to or analogously to a literature described in the field.

The silanol condensation catalyst (SCC), if present, is preferably selected from the group C of carboxylates of metals, such as tin, zinc, iron, lead and cobalt; of a titanium compound bearing a group hydrolysable to a Brönsted acid (preferably as described in the EP Application, no. EP10166636.0) or aromatic organic acids, such as aromatic organic sulphonic acids. The silanol condensation catalyst (SCC), if present, is more preferably selected from DBTL (dibutyl tin dilaurate), DOTL (dioctyl tin dilaurate), particularly DOTL; titanium compound bearing a group hydrolysable to a Brönsted acid as defined above; or an aromatic organic sulphonic acid which has a well known meaning.

The amount of the silanol condensation catalyst (SCC), if present, is typically 0.00001 to 0.1 mol/kg polymer composition preferably 0.0001 to 0.01 mol/kg polymer composition, more preferably 0.0005 to 0.005 mol/kg polymer composition. The choice of the SCC and the feasible amount thereof depends on the end application and is well within the skills of a skilled person.

It is to be understood that the polymer composition may comprise the SCC before it is used to form an article, preferably the at least one layer of a layer element, preferably the at least one layer of a layer element of a photovoltaic module, or the SCC may be introduced to the polymer composition after the formation of an article, preferably the at least one layer of a layer element, preferably the at least one layer of a layer element of a photovoltaic module. E.g. the at least one layer is part of a multilayer element wherein the SCC is present in a layer adjacent to and in direct contact with said at least one layer of the invention, whereby the SCC migrates to the at least one layer of the invention during the crosslinking step of the formed article.

In the most preferred embodiment, the polymer composition in the final article, preferably in the at least one layer of a layer element of the photovoltaic module, is without (i.e. does not contain) any SCC as defined above, preferably without a crosslinking catalyst selected from the above preferable group C.

Moreover, it is preferred that the polymer composition in the final article, preferably in the at least one layer of a layer element of the photovoltaic module, is not crosslinked, i.e. is non-crosslinked, with said SCC as defined above, preferably a crosslinking catalyst selected from the preferable group C of SCC, which SCCs are conventionally supplied or known as a silane crosslinking agent. In one embodiment the polymer composition in the final article, preferably in the at least one layer of a layer element of the photovoltaic module, is not crosslinked, i.e. is non-crosslinked, using peroxide or SCC which is suitably selected from the above group C.

The polymer composition may contain further component (s), such as further polymer component(s), which are different from the polymer of ethylene (a), and optionally additive(s) and/or fillers.

As to optional additives, the polymer composition of the invention preferably contains conventional additives for photovoltaic module applications, including without limiting to, antioxidants, UV light stabilisers, nucleating agents, clarifiers, brighteners, acid scavengers, processing agents as well as slip agents, preferably one or more additives selected at least from a group A of antioxidants, UV light stabilisers, nucleating agents, clarifiers, brighteners, acid scavengers, processing agents and slip agents. The additives can be used in conventional amounts.

The polymer composition of the invention may comprise, depending on the article, preferably depending on the layer element, of the invention, also fillers which are different from said additives. Typically the amounts of fillers are higher than the amounts of the additives as defined above. As non-limiting examples e.g. flame retardants (FRs), carbon black and titanium oxide can be mentioned. As examples of flame retardants as said fillers, e.g. magnesium-hydroxide and ammonium polyphosphate can be mentioned. Preferably the optional filler is selected from one or more of the group F of FRs, which are preferably one or two of magnesiumhydroxide and ammonium polyphosphate, titanium oxide and carbon black. The amount of the filler in general depends on the nature of the filler and the desired end application, as evident for a skilled person.

Such additives and fillers are generally commercially available and are described, for example, in "Plastic Additives Handbook", 5th edition, 2001 of Hans Zweifel. Examples of suitable antioxidants as additives for stabilisation of polyolefins containing hydrolysable silane groups which are crosslinked with a silanol condensation catalyst, in particular an acidic silanol condensation catalyst are disclosed in EP 1254923. Other preferred antioxidants are disclosed in WO 2005003199A1. Moreover, the above additives are excluded from the definition of a silane condensation catalyst (SCC).

The additives and fillers as defined above may have several functional activities, such as contribute to any one or more of stabilizing, pigmenting, clarifying, nucleating or crosslinking activity.

Accordingly, in one embodiment the polymer composition of the invention preferably comprises abovementioned additives, then the polymer composition of the invention comprises, based on the total amount (100 wt %) of the polymer composition, 85 to 99.99 wt % of the polymer of ethylene (a),
silane group(s) containing units (b), which are preferably present in the polymer of ethylene (a) as the preferable functional group(s) containing units, in amounts as defined later below, and
0.01 to 15 wt % of additive(s).

The total amount of optional and preferable additives is preferably from 0.1 to 10 wt %, more preferably from 0.2 to 10 wt %, more preferably from 0.4 to 10 wt %, more preferably from 0.5 to 10 wt %, based on the total amount (100 wt %) of the polymer composition.

As already stated, the polymer composition of the invention can comprise, in addition to optional and preferable additives as defined above, optionally also fillers, such as FRs, titanium oxide or carbon black, then the polymer composition of the invention comprises, based on the total amount (100 wt %) of the polymer composition, 15 to 94.99 wt % of the polymer of ethylene (a),
silane group(s) containing units (b), which are preferably present in the polymer of ethylene (a) as the preferable functional group(s) containing units, in amounts as defined later below,
0.01 to 15 wt % of additive(s), and
5 to 70 wt % of optional filler.

The total amount of the optional filler is preferably 10 to 70 wt %, more preferably 20 to 60 wt %, based on the total amount (100 wt %) of the polymer composition.

In the preferred embodiment of the invention the polymer composition comprises additives, preferably at least one or more additives of the above group A, and optionally fillers.

More preferably, the polymer composition comprises additives, preferably at least one or more additives of above group A, and no fillers. Accordingly in the more preferable embodiment fillers, preferably fillers of the above group F, are not present in the polymer composition.

The amount of polymer of ethylene (a) in the polymer composition of the invention is preferably of at least 35 wt %, preferably of at least 40 wt %, preferably of at least 50 wt %, preferably of at least 75 wt %, preferably of from 80 to 100 wt %, preferably of from 85 to 99.99 wt %, preferably of from 90 to 99.9 wt %, more preferably of from 90 to 99.8 wt %, more preferably of from 90 to 99.6 wt %, more preferably of from 90 to 99.5 wt %, based on the total amount of the polymer component(s) present in the polymer composition. The preferred polymer composition consists of polymer of ethylene (a) as the only polymer component(s). The expression means that the polymer composition does not contain further polymer component(s), but the polymer of ethylene (a) as the sole polymer component. However, it is to be understood herein that the polymer composition may comprise further component(s) other than the polymer of ethylene (a) component, such as the preferable additive(s) and/or filler(s) which may optionally be added in a so called master batch (MB) which is a mixture of an additive(s) and/or filler(s) together with a carrier polymer. If any additive or filler is added as a MB together with a carrier polymer, then the amount of the carrier polymer is calculated to the total amount of the additive or, respectively, to the total amount of the filler. I.e. the amount of carrier polymer of an optional MB is not calculated to the amount of polymer component(s).

In a preferred embodiment, the polymer composition comprises, preferably consists of, the polymer of ethylene (a), silane group(s) containing units (b), which are present in the polymer of ethylene (a) as the preferable functional group(s) containing units, and additives(s), preferably at least one or more additives of group A, which are preferably in amounts as given above.

In the most preferred embodiment of the invention the at least one layer is at least one layer of a photovoltaic layer element, preferably of an encapsulation element, wherein said at least one layer comprises the polymer composition comprising, preferably consisting of, the polymer of ethylene (a), silane group(s) containing units (b), which are present in the polymer of ethylene (a) as the preferable functional group(s) containing units, and additives(s), preferably at least one or more additives of group A, which are preferably in amounts as given above.

The following preferable embodiments, properties and subgroups of the polymer composition and the components thereof, namely polymer of ethylene (a) and the article including the preferable embodiments thereof, are independently generalisable so that they can be used in any order or combination to further define the preferable embodiments of the polymer composition and the article of the invention. Moreover, unless otherwise stated, it is evident that the above and below properties, preferable ranges of the properties and preferable subgroups of polymer of ethylene (a) apply to the polyolefin prior optional crosslinking.

Polymer Composition, Polymer of Ethylene (a) and Silane Group(s) Containing Units (b)

The polymer composition of the invention comprises
i) a polymer of ethylene (a) with a polar comonomer(s), wherein
   the polar comonomer is selected from the group of methyl acrylate and methyl methacrylate, and wherein
   the polymer of ethylene (a) optionally bears functional group(s) containing units other than said polar comonomer, and
ii) silane group(s) containing units (b),
wherein the polymer composition, preferably the polymer of ethylene (a), has
   an $MFR_2$ of 13 to 70 g/10 min (according to ISO 1133 at 190° C. and at a load of 2.16 kg), and
   a Shear Thinning Index, $SHI_{0.05/300}$, of 10.0 to 35.0, when measured according to "Rheological properties: Dynamic Shear Measurements (frequency sweep measurements)" as described below under "Determination Methods".

The $MFR_2$ of the polymer composition, preferably of the polymer of ethylene (a), is preferably from 13 to 50, preferably from 13 to 45, more preferably from 15 to 40, g/10 min.

The polymer composition, preferably the polymer of ethylene (a), has preferably a Shear Thinning Index, $SHI_{0.05/300}$, of 10.0 to 30.0, more preferably of 11.0 to 28.0, most preferably of 12.0 to 25.0, when measured according to "Rheological properties: Dynamic Shear Measurements (frequency sweep measurements)" as described below under "Determination Methods".

The polymer composition, preferably the polymer of ethylene (a), has preferably a Transmittance of at least 88.2%, preferably at least 88.3 to 95.0%, 88.3 to 92.0%, 88.3 to 91.0%, 88.4 to 90.0%, when measured according to "Transmittance" as described below under "Determination Methods".

Preferably, the polymer composition has advantageous Refractive properties. The difference in Refractive Index (RI) of the polymer composition, preferably of the polymer of ethylene (a), within the temperature range from 10 to 70° C. is less than 0.0340, preferably less than 0.0330, preferably less than 0.0320, more preferably from 0.0100 to 0.0310, when measured according to "Refractive Index" measurement as described below under "Determination Methods". The RI has a well known meaning and determines how much light is bent, or refracted, when entering a material. The refractive indices also determine for example the amount of light that is reflected when reaching the interface, as well as the critical angle for total internal reflection.

The content of polar comonomer present in the polymer of ethylene (a), is preferably of 4.5 to 18 mol %, preferably of 5.0 to 18.0 mol %, preferably of 6.0 to 18.0 mol %, preferably of 6.0 to 16.5 mol %, more preferably of 6.8 to 15.0 mol %, more preferably of 7.0 to 13.5 mol %, when measured according to "Comonomer contents" as described below under the "Determination methods". The preferable comonomer content contributes to the above mentioned advantageous properties of the polymer composition.

The polymer composition, preferably the polymer of ethylene (a), has preferably a G'(at 5 kPa) of 2000 to 5000, preferably 2500 to 4000, preferably 2400 to 3800, more preferably 2500 to 3600, kPa, when measured according to "Rheological properties: Dynamic Shear Measurements (frequency sweep measurements)" as described below under "Determination Methods".

The polymer of ethylene (a) has preferably a weight average molecular weight Mw of at least 70 000, preferably from 80 000 to 300 000, preferably from 90 000 to 200 000, more preferably from 91 000 to 180 000, most preferably from 92 000 to 150 000, when measured according to "Molecular weights, molecular weight distribution (Mn, Mw, MWD)-GPC" as described below under the "Determination methods". The claimed Mw range together with the presence of long chain branches of the polymer of ethylene (a) contributes to the advantageous rheological properties.

Moreover the polymer composition has excellent water permeability properties. The polymer composition, preferably the polymer of ethylene (a), has preferably a Water Permeation of 20 000 or less, preferably 100 to 18 000, more preferably 200 to 15 000, mg-mm/(m2-day), when measured at 38° C. according to ISO 15106-3:2003 as described below in "Water Permeation" method under "Determination Methods".

The polymer composition, preferably the polymer of ethylene (a), has preferably 1) a Tensile modulus MD of 6 to 30 MPa, or 2) a Tensile modulus TD of 5 to 30 MPa, preferably has 1) a Tensile modulus MD of 6 to 30 MPa, and 2) a Tensile modulus TD of 5 to 30 MPa, when measured according to "Tensile Modulus, ASTM D 882-A" as described below under "Determination Methods".

The polymer of ethylene (a) has preferably a Melt Temperature of 70° C. or more, preferably 75° C. or more, more preferably 78° C. or more, when measured according to ISO 3146 as described below under "Determination Methods". Preferably the upper limit of the Melt Temperature is 100° C. or below.

Furthermore, the polymer composition, preferably the polymer of ethylene (a), has preferably electrical properties, indicated as volume resistivity, which are unexpectedly good at wide temperature range, i.e. similar to volume resistivity performance of non-polar ethylene polymers. Moreover, the volume resistivity of the polymer composition, preferably of the polymer of ethylene (a), can be even higher at higher temperatures compared to non-polar ethylene polymers. Also the so called surface resistivity is surprisingly high compared to non-polar ethylene polymer. The voltages used in the determination of the volume resistivity, are 1000V. The pre-conditioning of the samples are done in dry conditions 48 hours at ambient temperature in relative humidity below 5%. Preferably not more than the one polar comonomer as defined above, below or claims is present in the polar polymer. Accordingly, most preferably the polar comonomer is methyl acrylate. The preferred methyl acrylate, preferably in the preferable amounts as defined above, below or in claims, of the polar polymer with additionally silane group(s) containing units contributes to the unexpectedly good optical properties such as transmission and refractive index, and unexpectedly good rheological properties.

As mentioned, the polar polymer preferably bears functional group(s) containing units which are different from said polar comonomer as defined above or below. Such functional group(s) containing units can be incorporated to the polar polymer by copolymerising a comonomer containing the functional group(s) or by grafting a functional group(s) containing compound.

In a preferred embodiment said polar polymer is a polymer of ethylene with methyl acrylate comonomer and preferably with functional group(s) containing units.

As stated above, most preferably the silane group(s) containing units (b) of the polymer composition are present in the polymer of ethylene (a) as the preferable functional group(s) containing units. Accordingly said polymer of ethylene (a) with a polar comonomer(s), preferably with one polar comonomer as defined above or in claims, bears additionally functional group(s) containing units which are said silane group(s) containing units (b). Such silane group(s) containing units (b) may be incorporated into the polar polymer by copolymerising ethylene together with the polar comonomer(s) and a silane group(s) containing comonomer or by copolymerising ethylene together with the polar comonomer(s) and then by grafting the obtained polar polymer with silane group(s) containing compound. Grafting is a chemical modification of the polymer by addition of silane groups containing compound usually in a radical reaction as well known in the art.

It is preferred that the silane group(s) containing units (b) are present in the polymer of ethylene (a) in the form of copolymerized comonomer units. The copolymerization provides more uniform incorporation of the units (b) and the resulting side branch is sterically less hindering compared to grafting of the same units (by grafting the length of the resulting branch of the unit is one carbon atom longer).

The silane group(s) containing units (b), which are present in the preferred polar polymer in the form of a grafted compound or, more preferably, in the form of copolymerized comonomer units, as the optional and preferred functional group(s) containing units, are preferably hydrolysable and crosslinkable by hydrolysis and subsequent condensation in the presence of a silanol condensation catalyst, as described below, and H$_2$O in a manner known in the art.

Furthermore, the silane group(s) containing units (b) present in the polymer of ethylene (a) is preferably in a form of a hydrolysable silane compound or, preferably, in form of a hydrolysable silane comonomer units of formula (I) as defined later below. Even more preferably said preferable hydrolysable silane group(s) containing units of formula (I) present in the polymer of ethylene (a) are in form of a hydrolysable silane compound or, preferably, in form of a hydrolysable silane comonomer unit of formula (II) as defined later below including the preferable subgroups and embodiments thereof.

The hydrolysable silane group(s) containing compound for grafting silane group(s) containing units (b) as the optional and preferable functional group(s) of the polymer of ethylene (a) or, preferably, the hydrolysable silane group(s) containing comonomer units for copolymerising silane group(s) containing units (b) as the functional group(s) containing units to the polymer of ethylene (a) is preferably an unsaturated silane compound or, preferably, comonomer unit of formula (I)

$$R^1SiR^2_qY_{3-q} \quad (I)$$

wherein
R$^1$ is an ethylenically unsaturated hydrocarbyl, hydrocarbyloxy or (meth)acryloxy hydrocarbyl group,
each R$^2$ is independently an aliphatic saturated hydrocarbyl group,
Y which may be the same or different, is a hydrolysable organic group and
q is 0, 1 or 2.

Special examples of the unsaturated silane compound are those wherein R$^1$ is vinyl, allyl, isopropenyl, butenyl, cyclohexanyl or gamma-(meth)acryloxy propyl; Y is methoxy, ethoxy, formyloxy, acetoxy, propionyloxy or an alkyl- or arylamino group; and R$^2$, if present, is a methyl, ethyl, propyl, decyl or phenyl group.

Further suitable silane compounds or, preferably, comonomers are e.g. gamma-(meth)acryloxypropyl trimethoxysilane, gamma(meth)acryloxypropyl triethoxysilane, and vinyl triacetoxysilane, or combinations of two or more thereof.

As a preferable subgroup of unit of formula (I) is an unsaturated silane compound or, preferably, comonomer of formula (II)

$$CH_2=CHSi(OA)_3 \quad (II)$$

wherein each A is independently a hydrocarbyl group having 1-8 carbon atoms, preferably 1-4 carbon atoms.

Preferred comonomers/compounds of the formula (II) are vinyl trimethoxysilane, vinyl bismethoxyethoxysilane, vinyl triethoxysilane, vinyl trimethoxysilane being the most preferred.

The amount of the silane group(s) containing units (b) (preferably present in the polymer of ethylene (a) as the preferable functional group(s) containing units) present in the polymer composition, preferably in the polymer of ethylene (a), is from 0.01 to 1.00 mol %, preferably from 0.05 to 0.80 mol %, more preferably from 0.10 to 0.60 mol %, more preferably from 0.10 to 0.50 mol %, when determined according to "Comonomer contents" as described below under "Determination Methods".

It is preferred that the silane group(s) containing units (b) as said preferable functional group(s) containing units are copolymerized as a comonomer with ethylene and the polar comonomer(s). I.e. a silane group(s) containing unit (b), as defined below or in claims, as the preferable functional group(s) containing units is in a form of a comonomer present in the polymer of ethylene (a).

The most preferred polar polymer which preferably contains silane group(s) containing units (b) as the optional and preferable functional group(s) containing units is a polymer of ethylene with methyl acrylate comonomer and with a silane group(s) containing comonomer as defined above or in claims, preferably with a silane group(s) containing comonomer which is a vinyl trimethoxysilane comonomer.

It is preferred that the polar polymer, preferably the polar polymer of the at least one layer of the layer element of the article, preferably of the photovoltaic module, of the invention is without, i.e. does not contain, maleic anhydride (MAH) grafted functional group(s) containing units, preferably is without any grafted functional group(s) containing units.

The polar polymer of the invention suitable for the article, preferably layer, of the invention can be e.g. commercially available or can be prepared according to or analogously to known polymerization processes described in the chemical literature.

It is preferred that the polymer of ethylene (a) of the invention is produced by polymerising ethylene with one or more polar comonomers, preferably one polar comonomer, and preferably with said silane group(s) containing comonomer as defined above in a high pressure (HP) process using free radical polymerization in the presence of one or more initiator(s) and optionally using a chain transfer agent (CTA) to control the MFR of the polymer. The HP reactor can be e.g. a well known tubular or autoclave reactor or a mixture thereof, preferably a tubular reactor. The high pressure (HP) polymerisation and the adjustment of process conditions for further tailoring the other properties of the polyolefin depending on the desired end application are well known and described in the literature, and can readily be used by a skilled person. Suitable polymerisation temperatures range up to 400° C., preferably from 80 to 350° C. and pressure from 70 MPa, preferably 100 to 400 MPa, more preferably from 100 to 350 MPa. The high pressure polymerization is generally performed at pressures of 100 to 400 MPa and at temperatures of 80 to 350° C. Such processes are well known and well documented in the literature and will be further described later below.

The incorporation of the polar comonomer(s) and the optional, and preferable, hydrolysable silane group(s) containing comonomer (as well as optional other comonomer (s)) and the control of the comonomer feed to obtain the desired final content of said (hydrolysable) silane group(s) containing units) can be carried out in a well known manner and is within the skills of a skilled person.

Further details of the production of ethylene (co)polymers by high pressure radical polymerization can be found i.a. in the Encyclopedia of Polymer Science and Engineering, Vol. 6 (1986), pp 383-410 and Encyclopedia of Materials: Science and Technology, 2001 Elsevier Science Ltd.: "Polyethylene: High-pressure, R. Klimesch, D. Littmann and F.-O. Mahling pp. 7181-7184.

Such HP polymerisation results in a so called low density polymer of ethylene (LDPE) with polar comonomer(s) as defined above and optionally, and preferably, a silane group(s) containing comonomer as the silane group(s) containing units (b). The term LDPE has a well known meaning in the polymer field and describes the nature of polyethylene produced in HP, i.e the typical features, such as different branching architecture, to distinguish the LDPE from PE produced in the presence of an olefin polymerisation catalyst (also known as a coordination catalyst). Although the term LDPE is an abbreviation for low density polyethylene, the term is understood not to limit the density range, but covers the LDPE-like HP polyethylenes with low, medium and higher densities.

The most preferred polar polymer of the invention is a polymer of ethylene with methyl acrylate comonomer and a silane group(s) containing units (b) in form of comonomer, preferably a vinyl trimethoxysilane comonomer, as the preferable functional group(s) containing units, wherein the polymer is produced by a high pressure polymerisation (HP).

Most preferably the polar polymer is a terpolymer of ethylene with methyl acrylate comonomer and a hydrolysable silane group(s) containing comonomer as defined above or in claims. It is preferred that said terpolymer is produced by higher pressure polymerization.

Typically, and preferably the density of the polymer of ethylene (a), is higher than 860 kg/m$^3$. Preferably the density of such LDPE polymer, is not higher than 970 kg/m$^3$, and preferably is from 920 to 960 kg/m$^3$, according to ISO 1872-2 as described below under "Determination Methods". In one suitable embodiment the invention, the density of the polymer of ethylene (a) is 930-957 kg/m$^3$, suitably 940-957 kg/m$^3$.

End Use of the Polymer Composition

Photovoltaic Module

The preferred article of the invention is a photovoltaic module comprising at least one photovoltaic element and a layer element comprising at least one layer, which comprises, preferably consists of, the polymer composition of the invention as defined above, below or in claims. The layer element of said preferred photovoltaic module can be a monolayer element or a multilayer element.

In one preferable embodiment said at least one layer of a layer element of the photovoltaic module comprising, preferably consisting of, the polymer composition is a laminated monolayer element or a laminated multilayer element.

In another equally preferable embodiment said at least one layer of a layer element of the photovoltaic module comprising, preferably consisting of, the polymer composition is an extruded, optionally coextruded, monolayer element or a multilayer element.

It is preferred that said at least one layer comprising the polymer composition is a layer of an encapsulation element of a photovoltaic module. More preferably said at least one layer is a layer of an encapsulation element of a photovoltaic module and consists of the polymer composition of the invention.

The encapsulation element comprising said at least one layer of the invention, can be a front encapsulation element or a rear encapsulation element, or both.

The encapsulation element comprising, preferably consisting of, said at least one layer of the invention is most preferably a front and/or a rear encapsulation monolayer element which comprises, preferably consists of, the polymer composition of the invention. Said front and/or rear encapsulation monolayer element comprising, preferably consisting of, the polymer composition of the invention is preferably extruded or laminated to adjacent layer elements or coextruded with a layer(s) of an adjacent layer element.

Most preferably the photovoltaic module of the invention comprises a front and rear encapsulation element, preferably a front encapsulation monolayer element and a rear encapsulation monolayer element, which comprise, preferably consist of, the polymer composition of the invention.

The thickness of the preferred encapsulation monolayer or multilayer element can vary depending on the type of the photovoltaic module, as known by a skilled person. Preferably, the thickness of the encapsulation monolayer or multilayer element is at least 100 μm, more preferably at least 150 μm, even more preferably from 0.02 to 2 mm, more preferably from 0.1 to 1 mm, more preferably from 0.2 to 0.6 mm, most preferably from 0.3 to 0.6 mm.

As well known, the elements and the layer structure of the photovoltaic module of the invention can vary depending on the desired type of the module. The photovoltaic module can be rigid or flexible. FIG. 1 illustrates one preferable photovoltaic module of the invention which comprises a protective top element, e.g. a glass front sheet (glass front cover), front encapsulation element (front encapsulant), photovoltaic cell(s) element(s) (photovoltaic cells+connectors), rear encapsulation element (rear encapsulant), backsheet element, preferably backsheet multilayer element, and optionally a protective cover, like a metal frame, such as aluminium frame (with junction box). Moreover, the above elements can be monolayer elements or multilayer elements. Preferably at least one of said front or rear encapsulation element, or, and preferably, both the front encapsulation element and rear encapsulation element, comprise at least one layer comprising, preferably consisting of, the polymer composition of the invention. More preferably, at least one of said front encapsulation element or rear encapsulation element, or, and preferably, both the front encapsulation element and rear encapsulation element, is a monolayer element which comprises, preferably consists of, the polymer composition of the invention. As well known the above photovoltaic module may have further layer element(s) in addition to above mentioned elements.

Moreover, any of the layer elements may be multilayer elements and comprise also adhesive layers, as mentioned earlier above, for improving the adhesion of the layers of the multilayer element. There can be adhesive layers also between the different elements. As already mentioned, the at least one layer of the invention does not mean any optional adhesive layer comprising the MAH-grafted polymer of ethylene (a). However, the photomodule of the invention may additionally comprise adhesive layer(s) comprising e.g. maleic anhydride (MAH) grafted composition of the invention.

The materials for glass sheets, photovoltaic element(s) and for optional further layers of layer elements (such as backsheet element), which are other than the at least one layer of the polymer composition of the invention, are e.g. well known in the photovoltaic module field and are commercially available or can be produced according to or analogously to the methods known in the literature for the photovoltaic module field.

The photovoltaic module of the invention can be produced in a manner well known in the field of the photovoltaic modules. The polymeric layer elements can be produced for example by extrusion, preferably by cast film extrusion, in a conventional manner using the conventional extruder and film formation equipment. The layers of any multilayer element(s) and/or any adjacent layer(s) between two layer elements can be partly or fully be coextruded or laminated.

The different elements of the photovoltaic module are typically assembled together by conventional means to produce the final photovoltaic module. Elements can be provided to such assembly step separately or e.g. two elements can fully or partly be in integrated form, as well known in the art. The different element parts can then be attached together by lamination using the conventional lamination techniques in the field. The assembling of photovoltaic module is well known in the field of photovoltaic modules.

Determination Methods

Unless otherwise stated in the description or in the experimental part, the following methods were used for the property determinations of the polymer composition, polar polymer and/or any sample preparations thereof as specified in the text or experimental part.

Melt Flow Rate

The melt flow rate (MFR) is determined according to ISO 1133 and is indicated in g/10 min. The MFR is an indication of the flowability, and hence the processability, of the polymer. The higher the melt flow rate, the lower the viscosity of the polymer. The MFR is determined at 190° C. for polyethylene. MFR may be determined at different loadings such as 2.16 kg ($MFR_2$) or 5 kg ($MFR_5$).

Density

Low density polyethylene (LDPE): The density of the polymer was measured according to ISO 1183-2. The sample preparation was executed according to ISO 1872-2 Table 3 Q (compression moulding).

Molecular Weights, Molecular Weight Distribution (Mn, Mw, MWD)-GPC

A PL 220 (Agilent) GPC equipped with a refractive index (RI), an online four capillary bridge viscometer (PL-BV 400-HT), and a dual light scattering detector (PL-LS 15/90 light scattering detector) with a 15° and 90° angle was used. 3× Olexis and 1× Olexis Guard columns from Agilent as stationary phase and 1,2,4-trichlorobenzene (TCB, stabilized with 250 mg/L 2,6-Di tert butyl-4-methyl-phenol) as mobile phase at 160° C. and at a constant flow rate of 1 mL/min was applied. 200 μL of sample solution were injected per analysis. All samples were prepared by dissolving 8.0-12.0 mg of polymer in 10 mL (at 160° C.) of stabilized TCB (same as mobile phase) for 2.5 hours for PP or 3 hours for PE at 160° C. under continuous gentle shaking. The injected concentration of the polymer solution at 160° C. ($c_{160° C.}$) was determined in the following way.

$$c_{160° C.} = \frac{w_{25}}{V_{25}} * 0.8772$$

With: $w_{25}$ (polymer weight) and $V_{25}$ (Volume of TCB at 25° C.).

The corresponding detector constants as well as the inter detector delay volumes were determined with a narrow PS standard (MWD=1.01) with a molar mass of 132900 g/mol and a viscosity of 0.4789 dl/g. The corresponding dn/dc for the used PS standard in TCB is 0.053 $cm^3$/g. The calculation was performed using the Cirrus Multi-Offline SEC-Software Version 3.2 (Agilent). The molar mass at each elution slice was calculated by using the 15° light scattering angle. Data collection, data processing and calculation were performed using the Cirrus Multi SEC-Software Version 3.2. The molecular weight was calculated using the option in the Cirrus software "use LS 15 angle" in the field "sample calculation options subfield slice MW data from". The dn/dc used for the determination of molecular weight was calculated from the detector constant of the RI detector, the concentration c of the sample and the area of the detector response of the analysed sample. This molecular weight at each slice is calculated in the manner as it is described by C. Jackson and H. G. Barth (C. Jackson and H. G. Barth, "Molecular Weight Sensitive Detectors" in: Handbook of Size Exclusion Chromatography and related techniques, C.-S. Wu, $2^{nd}$ ed., Marcel Dekker, New York, 2004, p. 103) at low angle. For the low and high molecular region in which less signal of the LS detector or RI detector respectively was achieved a linear fit was used to correlate the elution volume to the corresponding molecular weight. Depending on the sample the region of the linear fit was adjusted.

Molecular weight averages (Mz, Mw and Mn), Molecular weight distribution (MWD) and its broadness, described by polydispersity index, PDI=Mw/Mn (wherein Mn is the number average molecular weight and Mw is the weight average molecular weight) were determined by Gel Permeation Chromatography (GPC) according to ISO 16014-4:2003 and ASTM D 6474-99 using the following formulas:

$$M_n = \frac{\sum_{i=1}^{N} A_i}{\Sigma(A_i/M_i)} \quad (1)$$

$$M_w = \frac{\sum_{i=1}^{N} (A_i \times M_i)}{\Sigma A_i} \quad (2)$$

$$M_z = \frac{\sum_{i=1}^{N} (A_i \times M_i^2)}{\Sigma(A_i/M_i)} \quad (3)$$

For a constant elution volume interval $\Delta V_i$, where $A_i$ and $M_i$ are the chromatographic peak slice area and polyolefin molecular weight (MW) determined by GPC-LS.

Comonomer Contents:

The Content (Wt % and Mol %) of Polar Comonomer Present in the Polymer and the Content (Wt % and Mol %) of Silane Group(s) Containing Units (Preferably Comonomer) Present in the Polymer Composition (Preferably in the Polymer):

Quantitative nuclear-magnetic resonance (NMR) spectroscopy was used to quantify the comonomer content of the polymer composition or polymer as given above or below in the context.

Quantitative $^1$H NMR spectra recorded in the solution-state using a Bruker Advance III 400 NMR spectrometer operating at 400.15 MHz. All spectra were recorded using a standard broad-band inverse 5 mm probehead at 100° C. using nitrogen gas for all pneumatics. Approximately 200 mg of material was dissolved in 1,2-tetrachloroethane-$d_2$ (TCE-$d_2$) using ditertiarybutylhydroxytoluen (BHT) (CAS 128-37-0) as stabiliser. Standard single-pulse excitation was employed utilising a 30 degree pulse, a relaxation delay of 3 s and no sample rotation. A total of 16 transients were acquired per spectra using 2 dummy scans. A total of 32 k data points were collected per FID with a dwell time of 60 μs, which corresponded to a spectral window of approx. 20 ppm. The FID was then zero filled to 64 k data points and an exponential window function applied with 0.3 Hz line-broadening. This setup was chosen primarily for the ability to resolve the quantitative signals resulting from methyl-acrylate and vinyltrimethylsiloxane copolymerisation when present in the same polymer.

Quantitative $^1$H NMR spectra were processed, integrated and quantitative properties determined using custom spectral analysis automation programs. All chemical shifts were internally referenced to the residual protonated solvent signal at 5.95 ppm.

When present characteristic signals resulting from the incorporation of vinylacytate (VA), methyl acrylate (MA), butyl acrylate (BA) and vinyltrimethylsiloxane (VTMS), in various comonomer sequences, were observed (Randell89). All comonomer contents calculated with respect to all other monomers present in the polymer.

The vinylacytate (VA) incorporation was quantified using the integral of the signal at 4.84 ppm assigned to the *VA sites, accounting for the number of reporting nuclei per comonomer and correcting for the overlap of the OH protons from BHT when present:

$$VA = (I_{*VA} - (I_{ArBHT})/2)/1$$

The methylacrylate (MA) incorporation was quantified using the integral of the signal at 3.65 ppm assigned to the 1MA sites, accounting for the number of reporting nuclei per comonomer:

$$MA = I_{1MA}/3$$

The butylacrylate (BA) incorporation was quantified using the integral of the signal at 4.08 ppm assigned to the 4BA sites, accounting for the number of reporting nuclei per comonomer:

$$BA = I_{4BA}/2$$

The vinyltrimethylsiloxane incorporation was quantified using the integral of the signal at 3.56 ppm assigned to the 1VTMS sites, accounting for the number of reporting nuclei per comonomer:

$$VTMS = I_{1VTMS}/9$$

Characteristic signals resulting from the additional use of BHT as stabiliser, were observed. The BHT content was quantified using the integral of the signal at 6.93 ppm assigned to the ArBHT sites, accounting for the number of reporting nuclei per molecule:

$$BHT = I_{ArBHT}/2$$

The ethylene comonomer content was quantified using the integral of the bulk aliphatic (bulk) signal between 0.00-3.00 ppm. This integral may include the 1VA (3) and αVA (2) sites from isolated vinylacetate incorporation, *MA and αMA sites from isolated methylacrylate incorporation, 1BA (3), 2BA (2), 3BA (2), *BA (1) and αBA (2) sites from isolated butylacrylate incorporation, the *VTMS and αVTMS sites from isolated vinylsilane incorporation and the aliphatic sites from BHT as well as the sites from polyethylene sequences. The total ethylene comonomer content was calculated based on the bulk integral and compensating for the observed comonomer sequences and BHT:

$$E = (1/4)*[I_{bulk} - 5*VA - 3*MA - 10*BA - 3*VTMS - 21*BHT]$$

It should be noted that half of the α signals in the bulk signal represent ethylene and not comonomer and that an insignificant error is introduced due to the inability to compensate for the two saturated chain ends (S) without associated branch sites.

The total mole fractions of a given monomer (M) in the polymer was calculated as:

$$fM=M/(E+VA+MA+BA+VTMS)$$

The total comonomer incorporation of a given monomer (M) in mole percent was calculated from the mole fractions in the standard manner:

$$M[\text{mol }\%]=100*fM$$

The total comonomer incorporation of a given monomer (M) in weight percent was calculated from the mole fractions and molecular weight of the monomer (MW) in the standard manner:

$$M[\text{wt }\%]=100*(fM*MW)/((fVA*86.09)+(fMA*86.09)+(fBA*128.17)+(fVTMS*148.23)+((1-fVA-fMA-fBA-fVTMS)*28.05))$$

randall89

J. Randall, Macromol. Sci., Rev. Macromol. Chem. Phys. 1989, C29, 201.

If characteristic signals from other specific chemical species are observed the logic of quantification and/or compensation can be extended in a similar manor to that used for the specifically described chemical species. That is, identification of characteristic signals, quantification by integration of a specific signal or signals, scaling for the number of reported nuclei and compensation in the bulk integral and related calculations. Although this process is specific to the specific chemical species in question the approach is based on the basic principles of quantitative NMR spectroscopy of polymers and thus can be implemented by a person skilled in the art as needed.

Adhesion:

Film Sample Preparation:

Tapes (films) of the test polymer compositions (of inventive and comparative examples) with a dimension of 50 mm width and 0.45 mm thickness were extruded on a Collin teach-line E 20T extruder for the adhesion measurements. The tapes were produced with the following set temperatures: 150/150/150° C. and 50 rpm.

Adhesion Measurements:

The obtained extruded films of the test samples with a thickness of 0.45 mm were used for the adhesion measurements. The adhesion strength was measured on standard window glass. Adhesion samples were prepared by lamination of two films on a glass plate (dimensions 30×300×4 mm (b*l*d)) with a Teflon stripe between the glass and the film for the adhesion test measurement. On top of the two films also a back-sheet was placed before the lamination. Lamination was done at 150° C. for 15 minutes and a pressure of 800 mbar using a fully automated PV modules laminator P. Energy L036LAB. After the lamination a specimen was sliced out of the sample glass with a width of 15 mm for the peel strength measurement. The adhesion was measured on an Alwetron TCT 25 tensile machine with a peeling angle of 90 degrees and a peeling speed of 100 mm/min.

Transmittance

Film Sample Preparation:

Tapes (films) of the test polymer compositions (of inventive and comparative examples) with a dimension of 50 mm width and 0.45 mm thickness were extruded on a Collin teach-line E 20T extruder for the transmittance measurements. The tapes were produced with the following set temperatures: 150/150/150° C. and 50 rpm.

Transmittance Measurements:

The transmittance between 400 nm and 1150 nm was recorded with a Perkin Elmer Lambda 900 UV/VIS/NIR spectrometer equipped with a 150 mm integrating sphere. The solar weighted transmittance between 400 nm and 1150 nm was calculated using Formula 1 according to draft standard IEC 82/666/NP using the reference spectral photon irradiance as given in IEC 60904-3.

Transmittance can be seen as the total amount of light going through the sample including scattered and parallel transmittance (direct).

Tensile Modulus, ASTM D 882-A

Film Sample Preparation:

Tapes (films) of the test polymer compositions (of inventive and comparative examples) with a dimension of 50 mm width and 0.45 mm thickness were extruded on a Collin teach-line E 20T extruder for the tensile modulus measurements. The tapes were produced with the following set temperatures: 150/150/150° C. and 50 rpm.

Tensile Modulus Measurements:

were measured according to ASTM D 882-A. The speed of testing is 5 mm/min. The test temperature is 23° C. Width of the film was 25 mm.

Refractive Index (RI)

Film Sample Preparation:

Tapes (films) of the test polymer compositions (of inventive and comparative examples) with a dimension of 50 mm width and 0.45 mm thickness were extruded on a Collin teach-line E 20T extruder for the RI measurements. The tapes were produced with the following set temperatures: 150/150/150° C. and 50 rpm.

RI Measurements

Device: refractometer Anton Paar Abbemat

Conditions:

wavelength: 589.3 nm 3 measurements per film

Temperature range: 10 to 70° C. in 10° C. steps

Rheological Properties:

Dynamic Shear Measurements (Frequency Sweep Measurements)

The characterisation of melt of polymer composition or polymer as given above or below in the context by dynamic shear measurements complies with ISO standards 6721-1 and 6721-10. The measurements were performed on an Anton Paar MCR501 stress controlled rotational rheometer, equipped with a 25 mm parallel plate geometry. Measurements were undertaken on compression moulded plates, using nitrogen atmosphere and setting a strain within the linear viscoelastic regime. The oscillatory shear tests were done at 190° C. applying a frequency range between 0.01 and 600 rad/s and setting a gap of 1.3 mm.

In a dynamic shear experiment the probe is subjected to a homogeneous deformation at a sinusoidal varying shear strain or shear stress (strain and stress controlled mode, respectively). On a controlled strain experiment, the probe is subjected to a sinusoidal strain that can be expressed by $$\gamma(t)=\gamma_0 \sin(\omega t) \quad (1)$$

If the applied strain is within the linear viscoelastic regime, the resulting sinusoidal stress response can be given by $$\sigma(t)=\sigma_0 \sin(\omega t+\delta) \quad (2)$$

where $\sigma_0$ and $\gamma_0$ are the stress and strain amplitudes, respectively $\omega$ is the angular frequency $\delta$ is the phase shift (loss angle between applied strain and stress response)

t is the time

Dynamic test results are typically expressed by means of several different rheological functions, namely the shear storage modulus G', the shear loss modulus, G", the complex shear modulus, G*, the complex shear viscosity, η*, the dynamic shear viscosity, η', the out-of-phase component of the complex shear viscosity η" and the loss tangent, tan δ which can be expressed as follows:

$$G' = \frac{\sigma_0}{\gamma_0}\cos\delta \quad [Pa] \tag{3}$$

$$G'' = \frac{\sigma_0}{\gamma_0}\sin\delta \quad [Pa] \tag{4}$$

$$G^* = G' + iG'' \quad [Pa] \tag{5}$$

$$\eta^* = \eta' - i\eta'' \quad [Pa \cdot s] \tag{6}$$

$$\eta' = \frac{G''}{\omega} \quad [Pa \cdot s] \tag{7}$$

$$\eta'' = \frac{G'}{\omega} \quad [Pa \cdot s] \tag{8}$$

Besides the above mentioned rheological functions one can also determine other rheological parameters such as the so-called elasticity index EI(x). The elasticity index EI(x) is the value of the storage modulus, G' determined for a value of the loss modulus, G" of x kPa and can be described by equation (9).

$$EI(x)=G' \text{ for } (G''=x kPa)[Pa] \tag{9}$$

For example, the EI(5 kPa) is the defined by the value of the storage modulus G', determined for a value of G" equal to 5 kPa.

Shear Thinning Index ($SHI_{0.05/300}$) is defined as a ratio of two viscosities measured at frequencies 0.05 rad/s and 300 rad/s, $\mu_{0.05}/\mu_{300}$.

REFERENCES

[1] Rheological characterization of polyethylene fractions" Heino, E. L., Lehtinen, A., Tanner J., Seppälä, J., Neste Oy, Porvoo, Finland, Theor. Appl. Rheol., Proc. Int. Congr. Rheol., 11th (1992), 1, 360-362
[2] The influence of molecular structure on some rheological properties of polyethylene", Heino, E. L., Borealis Polymers Oy, Porvoo, Finland, Annual Transactions of the Nordic Rheology Society, 1995.).
[3] Definition of terms relating to the non-ultimate mechanical properties of polymers, Pure & Appl. Chem., Vol. 70, No. 3, pp. 701-754, 1998.
Water Permeation
Film Sample Preparation
Tapes (films) of the test polymer compositions (of inventive and comparative examples) with a dimension of 40 mm width and 0.45 mm thickness were extruded cast film extrusion line on a battenfield 60 extruder. The tapes were produced with the following set temperatures: 50/120/130° C. with 112 rpm.
Water Permeation Measurement:
was measured according to standard ISO 15106-3:2003.
Device: Mocon Aquatran
Temperature: 38° C.±0.3° C.
Relative Humidity: 0/100%
Area sample: 5 cm²
Volume Resistivity
Measured according to IEC 60093 from tape samples at 20° C. after Dry conditioning 48 h at Relative Humidity (RH)<5%.

EXPERIMENTAL PART

Preparation of Examples

Polymerisation of the polymers of inventive examples Ex. 1, Ex. 2 and Ex. 3 and the comparative example Comp. Ex. 1:

Inventive and comparative polymers were produced in a high pressure tubular reactor in a conventional manner using conventional peroxide initiator. Ethylene monomer, polar comonomer as identified in table 1 and vinyl trimethoxy silane (VTMS) comonomer (silane group(s) containing comonomer (b)) were added to the reactor system in a conventional manner. CTA was used to regulate MFR as well known for a skilled person.

The amount of the vinyl trimethoxy silane units, VTMS, (=silane group(s) containing units), the amount of MA and $MFR_2$ are given in the table 2.

The properties in below tables were measured from the polymer obtained from the reactor or from a film sample of the polymer as indicated below.

TABLE 1

Process conditions and product properties of Inventive and Comparative Examples

| | Test polymer | | | |
|---|---|---|---|---|
| | Inv.Ex.1 | Inv.Ex.2 | Inv.Ex.3 | Comp.Ex. 1 |
| Polymerisation conditions | | | | |
| Pressure, MPa | 250 | 250 | 250 | 250 |
| Max.temperature | 285 | 285 | 285 | 285 |
| Properties of the polymer obtained from the reactor | | | | |
| $MFR_{2,16}$, g/10 min | 16 | 20 | 18 | 7 |
| acrylate content, | MA | MA | MA | BA |
| mol % | 8.0 | 9.8 | 10.4 | 4.4 |
| Melt Temperature, ° C. | 89 | 86 | 85 | 96 |
| VTMS content, mol % | 0.23 | 0.23 | 0.45 | 0.35 |
| Density, kg/m³ | 945 | 951 | 955 | 927 |
| Mw* | 93 000 | 98 000 | 96 350 | 86 000 |
| MWD* | 5.1 | 6.9 | 4.6 | 5.1 |
| Properties measured from the film sample of the polymer | | | | |
| Tensile modulus MD, MPa | 20.8 | 14.1 | 11.1 | — |
| Tensile modulus TD, MPa | 19.3 | 12.8 | 9.8 | — |
| Volume resistivity, Ω-cm at 20° C. | 2.24E+16 | 9.36E+15 | 9.93E+15 | |

*Mw and MWD were measured after 1 week from production

TABLE 2

Transmittance properties measured from a film sample of a test polymer

| Film samples of the polymer | Transmittance (%) |
|---|---|
| Comp.Ex. 1 | 88.1 |
| Inv.Ex. 1 | 88.5 |
| Inv.Ex. 2 | 88.8 |
| Inv.Ex. 3 | 88.9 |

As seen from the increase in MFR and the higher comonomer content of the polymer of Inventive Examples result in higher transmission.

TABLE 3

Difference in the Refractive Index within the temperature range from 10 to 70° C.

| Test film sample of the polymer | Temp, ° C. | | | | | | |
|---|---|---|---|---|---|---|---|
| | 10 | 20 | 30 | 40 | 50 | 60 | 70 |
| | Refractive index (RI) | | | | | | |
| Comp. Ex. 2 | 1.4892 | 1.4847 | 1.4800 | 1.4735 | 1.4664 | 1.4600 | 1.4540 |
| Inv. Ex. 1 | 1.498 | 1.494 | 1.490 | 1.485 | 1.479 | 1.473 | 1.468 |
| Inv. Ex. 2 | 1.495 | 1.492 | 1.487 | 1.482 | 1.476 | 1.471 | 1.465 |

Comp. Ex. 2: Ethylene Vinyl Acetate (EVA) reference copolymer with Vinyl Acetate content of 33 wt % and $MFR_2$ of 40 g/10 min.

RI was measured from the test film samples at temperatures, 10, 20, 30, 40, 50, 60 and 70° C. The difference in the refractive index of the polymers of Inventive Examples within the temperature range from 10 to 70° C. is clearly less than that of Comp. Ex. 2.

RI of the polymers of Inventive Examples is also higher than RI of EVA.

TABLE 4

Water Permeation

| Test film polymer | RH* % | Permeation mg-mm/[m$^2$-day] |
|---|---|---|
| Inv.Ex.2 | 0/100 | 13706 |
| Inv.Ex.1 | 0/100 | 11391 |
| Comp.Ex.2 | 0/100 | 21603 |

*Relative Humidity

Storage Stability:

The below storage stability measurements and rheology data were determined from the polymer of Inv. Ex 3 and Inv. Ex. 4 obtained from the reactor.

Inv. Ex. 4 was produced as Inv. Ex. 1-3 adjusting the polymerisation conditions in a known manner to obtain MA content of 12.3 mol %, silane content of 0.48 mol %, $MFR_2$ of 34 g/10 min, density 960 kg/m$^3$ and Tm of 81° C. Volume resistivity of the polymer of the Inv. Ex. 4 was 2.59E+15, Ω-cm at 20° C. The polymer of Inv. Ex 4 was compounded in conventional amounts with conventional antioxidant (CAS number 32687-78-8) and UV-stabilising hindered amine compound (CAS number 71878-19-8, 70624-18-9 (in US)) and the film sample for the adhesion test was made from the compounded polymer composition.

The test example polymers were analysed for the storage stability for period of 14 weeks after the production. The Mn, Mw and Mz values and polydispersity measured with GPC using triple detector (RI-viscometer-light scattering, or as defined under Determination methods) are measured with Humidity 20% and temperature 22° C., are shown below. Table 5 gives GPC analysis of polymers of Inv. Ex. 4 and Inv. Ex. 3, respectively for period of 14 weeks. Table 5 shows that there are no significant difference in Mn, Mw and Mz within 14 weeks.

TABLE 5

GPC analysis

| | Weeks after production | Mn | Mw | Mz |
|---|---|---|---|---|
| Inv.Ex. 4 | 1 | 18676 | 101609 | 1166050 |
| | 2 | 18777 | 96632 | 728317 |
| | 3 | 19500 | 113000 | 2320000 |
| | 4 | 18800 | 109000 | 2048000 |
| | 7 | 19300 | 92000 | 937000 |
| | 10 | 19100 | 96000 | 1055000 |
| | 14 | 19400 | 97000 | 1045000 |
| RSTD (%) | | 3.7 | 6.1 | 28.6 |

TABLE 6

Rheology data of the test polymers

| Polymer Sample/measurement time after the polymer is obtained from the reactor | $eta_{0.05rad/s}$ [Pa·s] | $eta_{300rad/s}$ [Pa·s] | SHI (0.05/300) |
|---|---|---|---|
| Inv.Ex. 3 | 2269 | 147 | 15.43 |
| Inv.Ex. 4 | 1888 | 105 | 17.98 |
| Comp.Ex. 1 | 3793 | 208.00 | 18.23 |

TABLE 7

Storage stability shown with rheological analysis for Inv.Ex. 3

| Test Polymer/ measurement time after the polymer is obtained from the reactor | $eta_{0.05rad/s}$ [Pa·s] | $eta_{300rad/s}$ [Pa·s] | SHI (0.05/300) | $MFR_2$ g/10 min | G' kPa |
|---|---|---|---|---|---|
| Inv.Ex. 3 After obtained from reactor | 2269 | 147 | 15.43 | 17.67 | 2610 |
| Inv.Ex. 3 1 week | 2712 | 148 | 18.32 | 18.01 | |
| Inv.Ex. 3 2 weeks | 2429 | 147 | 16.52 | 17.79 | |
| Inv.Ex. 3 3 weeks | 2326 | 146 | 15.93 | 18.21 | |
| Inv.Ex. 3 4 weeks | 2332 | 147 | 15.86 | 17.47 | |
| Inv.Ex. 3 7 weeks | 2368 | 138 | 17.15 | 18.03 | |
| Inv.Ex. 3 9 weeks | 2465 | 147 | 16.76 | 16.74 | |
| Inv.Ex. 3 11 weeks | 2507 | 149 | 16.82 | 16.87 | |
| Inv.Ex. 3 14 weeks | 2668 | 148.00 | 18.02 | 16.65 | |

TABLE 8

Storage stability shown with rheological analysis for Inv.Ex.4

| Test Polymer/ measurement time after the polymer is obtained from the reactor | $eta_{0.05rad/s}$ [Pa·s] | $eta_{300rad/s}$ [Pa·s] | SHI (0.05/300) | MFR g/10 min |
|---|---|---|---|---|
| Inv.Ex. 4 After obtained from reactor | 1888 | 105 | 17.98 | 34.31 |
| Inv.Ex. 4 1 week | 1489 | 102 | 14.54 | 33.51 |

TABLE 8-continued

Storage stability shown with rheological analysis for Inv.Ex.4

| Test Polymer/ measurement time after the polymer is obtained from the reactor | $eta_{0.05rad/s}$ [Pa·s] | $eta_{300rad/s}$ [Pa·s] | SHI (0.05/300) | MFR g/10 min |
|---|---|---|---|---|
| Inv.Ex. 4 2 weeks | 1704 | 95 | 17.93 | 32.17 |
| Inv.Ex. 4 3 weeks | 1718 | 102 | 16.81 | 33.37 |
| Inv.Ex. 4 4 weeks | 1391 | 100 | 13.92 | 33.22 |
| Inv.Ex. 4 7 weeks | 1458 | 98 | 14.95 | 33.3 |
| Inv.Ex. 4 8 weeks | 1379 | 108 | 12.76 | 29.65 |
| Inv.Ex. 4 11 weeks | 1434 | 103 | 13.92 | 29.41 |
| Inv.Ex. 4 14 weeks | 1670 | 107.00 | 15.60 | 30.4 |

TABLE 9

Adhesion properties of the film samples of the test polymers

| | Polymer | | | |
|---|---|---|---|---|
| | Inv.Ex.1 | Inv.Ex.2 | Inv.Ex.3 | Comp.Ex.4 |
| Adhesion | >150 | >150 | >150 | <50 |

Comp. Ex. 4 is a commercial reference which is Ethylene Silane copolymer with Silane (originating from VTMS comonomer units) content of 0.35 mol % and MFR$_2$ of 1 g/10 min.

As can be see from the results, the inventive examples have superior adhesion properties compared to non-polar ethylene silane copolymer.

The invention claimed is:

1. A polymer composition comprising:
    i) a polymer of ethylene (a) with a polar comonomer(s), wherein
        the polar comonomer is selected from the group of methyl acrylate and methyl methacrylate, and wherein
        the polymer of ethylene (a) optionally bears functional group(s) containing units other than said polar comonomer, and
        the polymer of ethylene (a) has a melt temperature of 78° C. or more, and
    ii) silane group(s) containing units (b), wherein the silane group(s) containing units (b) and the polymer of ethylene (a) are present in the polymer composition as separate components or as a blend or the silane group (s) containing units (b) are present as a comonomer of the polymer of ethylene (a) or as a compound grafted to the polymer of ethylene (a), and
    wherein the polymer composition has
        an MFR$_2$ of 13 to 70 g/10 min (according to ISO 1133 at 190° C. and at a load of 2.16 kg), and
        a Shear Thinning Index, SHI$_{0.05/300}$, of 10.0 to 35.0, when measured according to ISO 6721-1 and 6721-10.

2. The polymer composition according to claim 1, wherein the MFR$_2$ of the polymer composition, is from 13 to 50 g/10 min.

3. The polymer composition according to claim 1, wherein the polymer composition has one or two of the rheological properties a) and b):
    a) Shear Thinning Index, SHI$_{0.05/300}$, of 10.0 to 30.0, and/or
    b) G"(at 5 kPa) of 2000 to 5000 kPa, when measured according to ISO 6721-1 and 6721-10.

4. The polymer composition according to claim 1, wherein difference in Refractive Index of the polymer composition within the temperature range from 10 to 70° C. is less than 0.0340, when measured in a refractometer.

5. The polymer composition according to claim 1, wherein the polymer composition has a Transmittance of at least 88.2% when measured in a UV/VIS/NIR spectrometer according to draft standard IEC 82/666/N.

6. The polymer composition according to claim 1, wherein the content of polar comonomer present in the polymer of ethylene (a) is of 4.5 to 18 mol %, when measured by quantitative $^1$H NMR.

7. The polymer composition according to claim 1, wherein the polymer of ethylene (a) has a weight average molecular weight Mw of at least 70 000.

8. The polymer composition according to claim 1, which has a Water Permeation of 20 000 or less mg-mm/(m2-day), when measured at 38° C. according to ISO 15106-3:2003.

9. The polymer composition according to claim 1, which has 1) a Tensile modulus MD of 6 to 30 MPa, or 2) a Tensile modulus TD of 5 to 30 MPa, when measured according to.

10. The polymer composition according to claim 1, wherein the density of the polymer of ethylene (a) is 930-957 kg/m$^3$.

11. The polymer composition according to claim 1, wherein the polymer of ethylene (a) with the polar comonomer(s) is a polymer of ethylene with methyl acrylate comonomer and optionally bears functional group(s) containing units.

12. The polymer composition according to claim 1, wherein the polymer of ethylene (a) with the polar comonomer(s) bears silane group(s) containing units (b) as said functional groups containing units, wherein the amount of the silane group(s) containing units (b) in the polymer of ethylene (a) is from 0.01 to 1.00 mol %, when determined by quantitative $^1$H NMR.

13. The polymer composition according to claim 1, wherein the silane group(s) containing units (b) as the functional groups bearing units are present in said polymer of ethylene (a) in form of comonomer units.

14. The polymer composition according to claim 1, wherein the silane group(s) containing comonomer unit or compound as silane group(s) containing units (b) is a hydrolysable unsaturated silane compound represented by the formula:

$$R^1SiR^2_qY_{3-q} \qquad (I)$$

wherein;
    $R^1$ is an ethylenically unsaturated hydrocarbyl, hydrocarbyloxy or (meth)acryloxy hydrocarbyl group,
    each $R^2$ is independently an aliphatic saturated hydrocarbyl group,
    Y which may be the same or different, is a hydrolysable organic group, and
    q is 0, 1 or 2.

15. The polymer composition according to claim 1, wherein the polar polymer of ethylene (a) is a copolymer of ethylene with methyl acrylate comonomer and a hydrolysable silane group(s) containing comonomer.

16. An article comprising the polymer composition according to claim 1.

17. The article according to claim 16, which is a layer element, wherein said layer element comprises at least one layer comprising the polymer composition.

18. The article according to claim 16, which is a photovoltaic module comprising at least one photovoltaic element and at least one layer element comprising at least one layer, wherein said at least one layer comprises the polymer composition.

19. A photovoltaic module comprising at least one photovoltaic element and at least one layer element which is a monolayer element comprising the polymer composition according to claim 1, or a multilayer element comprising two or more layer(s), wherein at least one layer comprises the polymer composition according to claim 1.

20. The photovoltaic module according to claim 19, wherein said at least one layer element is an encapsulation monolayer element comprising the polymer composition, or an encapsulation multilayer element which comprises at least one layer comprising the polymer composition.

* * * * *